(12) United States Patent
Hagen et al.

(10) Patent No.: US 7,755,178 B2
(45) Date of Patent: Jul. 13, 2010

(54) BASE SEMICONDUCTOR COMPONENT FOR A SEMICONDUCTOR COMPONENT STACK AND METHOD FOR THE PRODUCTION THEREOF

(75) Inventors: Robert-Christian Hagen, Sarching (DE); Jens Pohl, Bernhardswald (DE)

(73) Assignee: Infineon Technologies AG, Neubiberg (DE)

( * ) Notice: Subject to any disclaimer, the term of this patent is extended or adjusted under 35 U.S.C. 154(b) by 311 days.

(21) Appl. No.: 10/598,483

(22) PCT Filed: Feb. 23, 2005

(86) PCT No.: PCT/DE2005/000307

§ 371 (c)(1),
(2), (4) Date: Aug. 7, 2008

(87) PCT Pub. No.: WO2005/086235

PCT Pub. Date: Sep. 15, 2005

(65) Prior Publication Data

US 2008/0284043 A1 Nov. 20, 2008

(30) Foreign Application Priority Data

Mar. 2, 2004 (DE) .................... 10 2004 010 614

(51) Int. Cl.
*H01L 23/498* (2006.01)
(52) U.S. Cl. ................... 257/686; 257/E23.065
(58) Field of Classification Search .......... 257/E23.041, 257/E23.042, E23.049, E23.047, E23.187, 257/E23.055, E23.043, E23.01, E23.065, 257/E23.013, E25.013, 686, 723; 438/109; 361/790, 803
See application file for complete search history.

(56) References Cited

U.S. PATENT DOCUMENTS

| | | | | |
|---|---|---|---|---|
| 5,438,224 A | * | 8/1995 | Papageorge et al. | ......... 257/777 |
| 5,681,777 A | * | 10/1997 | Lynch et al. | ................. 29/827 |
| 6,255,723 B1 | * | 7/2001 | Light et al. | ................ 257/677 |
| 6,291,259 B1 | * | 9/2001 | Chun | ......................... 438/106 |
| 6,313,522 B1 | | 11/2001 | Akram et al. | |

(Continued)

FOREIGN PATENT DOCUMENTS

DE 10200268 A1 11/2002

(Continued)

OTHER PUBLICATIONS

Buschow, K.H. Jürgen; Cahn, Robert W.; Flemings, Merton C.; Ilschner, Bernhard; Kramer, Edward J.; Mahajan, Subhash "Encyclopedia of Materials—Science and Technology, vols. 1-11", 2001, Elsevier, p. 8332.*

*Primary Examiner*—Matthew C Landau
*Assistant Examiner*—Daren Wolverton
(74) *Attorney, Agent, or Firm*—Dicke, Billig & Czaja, PLLC

(57) ABSTRACT

A base semiconductor component for a semiconductor component stack is disclosed. In one embodiment, the base semiconductor component has a semiconductor chip arranged centrally on a stiff wiring substrate. The wiring substrate has, in its edge regions, contact pads which are electrically connected to external contacts and at the same time to contact areas of the semiconductor chip and also to stack contact areas. The stack contact areas simultaneously form the upper side of the base semiconductor component and have an arrangement pattern corresponding to an arrangement pattern of external contacts of a semiconductor component to be stacked.

15 Claims, 5 Drawing Sheets

U.S. PATENT DOCUMENTS

| | | |
|---|---|---|
| 6,407,448 B2 | 6/2002 | Chun |
| 6,437,433 B1 | 8/2002 | Ross |
| 7,006,360 B2 * | 2/2006 | Kim .......................... 361/790 |
| 7,309,913 B2 * | 12/2007 | Shim et al. ................ 257/686 |
| 2001/0028104 A1 | 10/2001 | Fukatsu et al. |
| 2002/0163077 A1 | 11/2002 | Kuwahara et al. |
| 2002/0180061 A1 * | 12/2002 | Caletka et al. ............. 257/778 |
| 2003/0020154 A1 | 1/2003 | Hashimoto |
| 2003/0030143 A1 | 2/2003 | Wennemuth et al. |
| 2003/0042591 A1 * | 3/2003 | Goller et al. ............... 257/686 |
| 2003/0111736 A1 * | 6/2003 | Roeters et al. ............. 257/777 |
| 2003/0134450 A1 * | 7/2003 | Lee ........................... 438/106 |
| 2003/0210533 A1 * | 11/2003 | Baek et al. ................. 361/760 |

FOREIGN PATENT DOCUMENTS

| | | |
|---|---|---|
| DE | 10138278 C1 | 4/2003 |

* cited by examiner

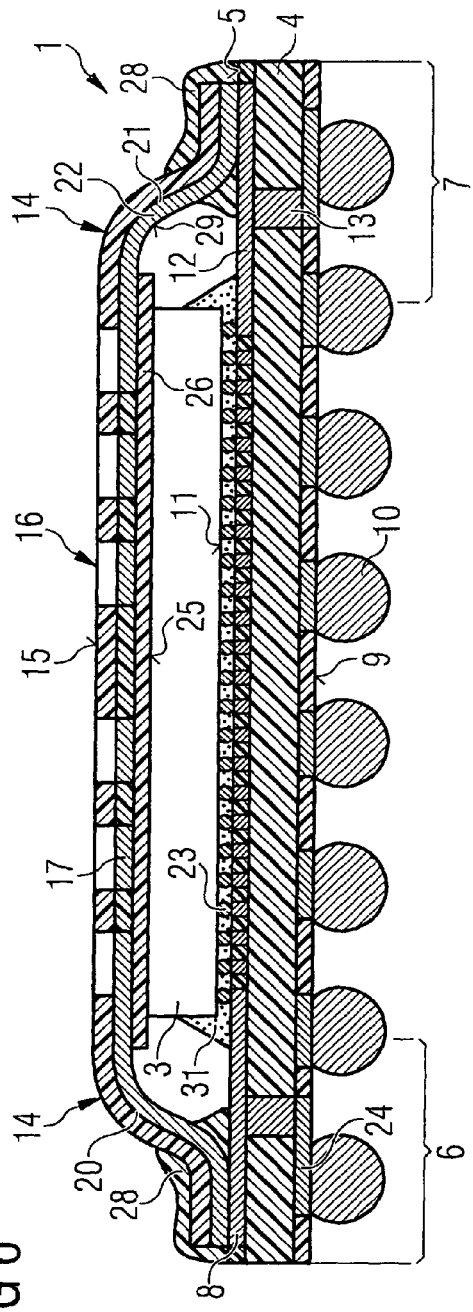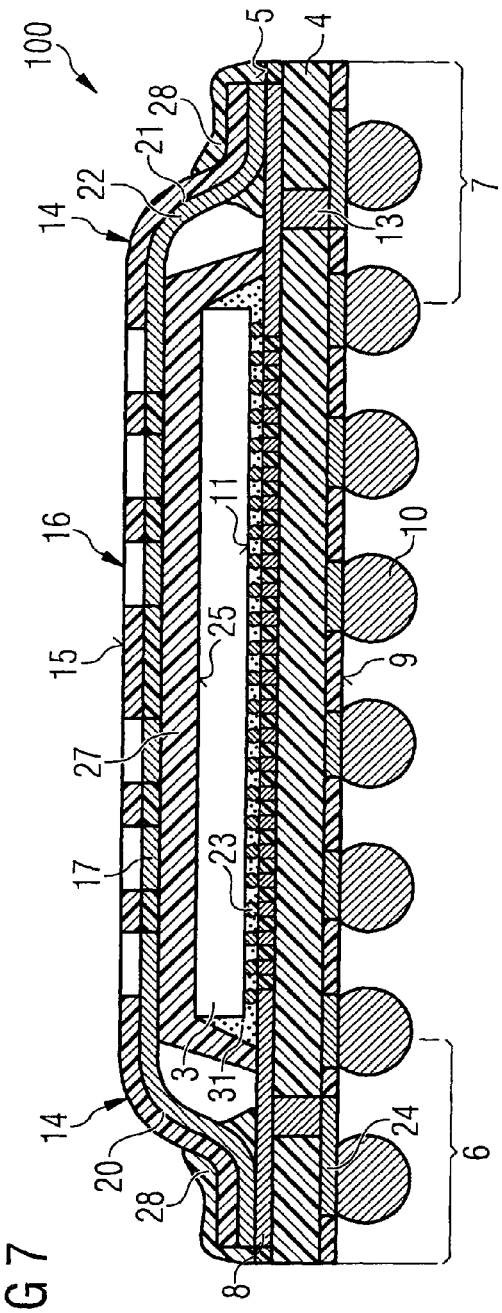

BASE SEMICONDUCTOR COMPONENT FOR A SEMICONDUCTOR COMPONENT STACK AND METHOD FOR THE PRODUCTION THEREOF

CROSS REFERENCE TO RELATED APPLICATION

This Patent Application claims the benefit of the filing date of German Application No. DE 10 2004 010 614.2, filed Mar. 2, 2004, and International Application No. PCT/DE2005/000307, filed Feb. 23, 2005, both of which are herein incorporated by reference.

Background

The invention provides a base semiconductor component for a semiconductor component stack having a semiconductor chip arranged centrally on an upper side of a stiff wiring substrate in such a way that edge regions of the wiring substrate are not covered by the semiconductor chip. External contacts of the base semiconductor component are arranged on an underside of the wiring substrate opposite to the upper side with the semiconductor chip, said external contacts being electrically connected via through contacts to contact pads on the upper side. The contact pads are arranged in edge regions of the wiring substrate.

For stacking semiconductor components with a base semiconductor component of this type, the position of the contacts between the lower base semiconductor component and a stacked upper semiconductor component is typically limited to the edge regions of the housing because the semiconductor chip is arranged centrally and, consequently, the central region is not available for the connection of contacts of stacked semiconductor components. This has the disadvantage that standardized semiconductor components of BGA design (ball grid array) or LGA design (land grid array) cannot be stacked one on top of another, especially as their external contacts are arranged in a manner distributed over the underside of the semiconductor component. Consequently, a customer cannot freely select stacked semiconductor components, rather the customized housing has to be reconfigured because for a stacked semiconductor component only the edge sides of the wiring substrate are available for the arrangement of external contacts of the stacked semiconductor component.

One solution to this stack problem is known from the document DE 101 38 278, wherein for stacking purposes conventional semiconductor components with a BGA or LGA housing are provided with additional flexible rewiring films which have a larger area than the base semiconductor components to be stacked and which project beyond the edge of the semiconductor components, so that they can be bent in the direction of a base semiconductor component of a semiconductor component stack arranged underneath and can be electrically connected via the flexible film to the base semiconductor component arranged underneath.

A semiconductor module having semiconductor components stacked in this way has the disadvantage that the semiconductor components cannot be stacked with the smallest possible space requirement, especially as the bent-away rewiring film also requires a bending radius that cannot be undershot without the risk of microcracks in the rewiring lines arranged on the rewiring film. What is more, line paths that are relatively long and also of varying length arise between the semiconductor chip in the lower base housing of the base semiconductor component and the stacked semiconductor component. Finally, the high costs for the two-layer film required are a further disadvantage of the previous solution.

For these and other reasons, there is a need for the present invention.

SUMMARY

One embodiment of the present invention provides a base semiconductor component having a wiring substrate and a method for the production thereof that enables a stacking of semiconductor components with external contacts arranged as desired. Furthermore, the invention makes it possible to combine this semiconductor component stack with differently constructed base components and with differently constructed stacked semiconductor components to form a semiconductor module. Moreover, the invention provides a base semiconductor component having a wiring substrate with which a stacking is not restricted to a few predetermined patterns of semiconductor components, but rather in which the arrangement and assignment of connecting external contacts can be varied as desired. Furthermore, the present invention minimizes the space requirement and the area requirement of a semiconductor module, and thus reduces the space requirement of a memory module having DRAM semiconductor components, by way of example.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIGS. 2 to 7 illustrate schematic cross sections through component elements in the course of the production of a base semiconductor component.

FIG. 2 illustrates a schematic cross section of an interconnection film with supporting plate.

FIG. 3 illustrates a schematic cross section of a stiff wiring substrate with semiconductor chip.

FIG. 4 illustrates a schematic cross section through a wiring substrate with semiconductor chip and emplaced interconnection film.

FIG. 5 illustrates a schematic cross section through a wiring substrate after the bending away of edge regions of the interconnection film and the electrical connection of the contact pads of the wiring substrate to conductor tracks of the interconnection film.

FIG. 6 illustrates a schematic cross section through a base semiconductor component with an applied plastic covering of the electrical connections.

FIG. 7 illustrates a schematic cross section through a base semiconductor component of a second embodiment of the invention.

DETAILED DESCRIPTION

Figure 1:
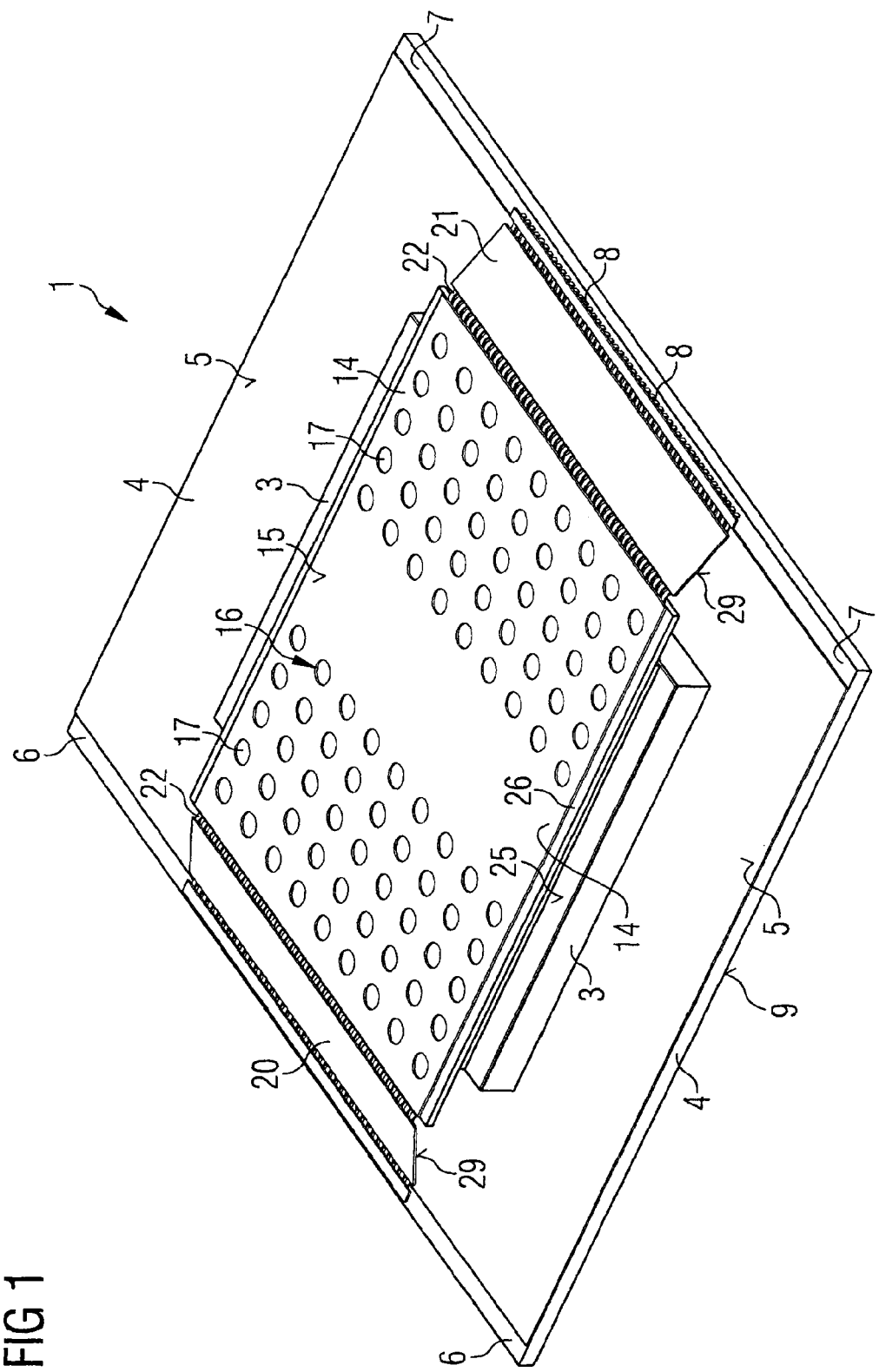
FIG. 1 illustrates a basic schematic diagram of a base semiconductor component of a first embodiment of the invention, in perspective view.

In the following Detailed Description, reference is made to the accompanying drawings, which form a part hereof, and in which is illustrated by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In one embodiment, the invention provides a base semiconductor component for a semiconductor component stack having a semiconductor chip arranged centrally on a stiff wiring substrate. For this purpose, the wiring substrate has contact pads on its upper side in edge regions and external contacts of the base semiconductor component on its underside opposite to the semiconductor chip. The external contacts are electrically connected to the contact pads via wiring lines and/or through contacts of the wiring substrate. At the same time the contact pads are connected to contact areas of an integrated circuit of the active upper side of the semiconductor chip. Consequently, an individual contact area with an individual external contact and with an individual contact pad are at the same electrical potential. In this case, the contact pad practically forms a circuit node.

A deformable interconnection film defines the upper side of the base component and has a freely accessible arrangement pattern of stack contact areas. Said arrangement pattern is arranged congruently with respect to external contacts of a semiconductor component to be stacked. In its edge regions, the interconnection film is deformed toward the contact pads of the wiring substrate. In this case, the stack contact areas on the upper side of the base semiconductor component are electrically connected via conductor tracks of the interconnection film to the contact pads in the edge regions of the wiring substrate. Consequently, via the common node formed by the contact pads on the wiring substrate, an individual stack contact is electrically connected to a contact area of the base semiconductor chip and to an external contact of the base semiconductor component.

The advantage of said base semiconductor component is that the deformable interconnection film has a freely selectable arrangement pattern of stack contact areas on its upper side. Said pattern can be adapted to the customer's requirement. For different semiconductor components to be stacked on the base semiconductor component, provision is made merely of an interconnection film having a different arrangement pattern. The basic construction of the base semiconductor component need not be changed, however. Both the central base semiconductor chip and the wiring structure of the wiring substrate and the arrangement of the external contacts of the base semiconductor component remain unchanged.

The interconnection film may also be used to provide passive components, such as capacitors, resistors or coils, by means of corresponding conductor track routing or by means of corresponding structuring of the metal layers of the interconnection film. A further advantage of this construction of a base semiconductor component is that a multiplicity of conductor tracks of the interconnection film together with a multiplicity of contact pads can be connected to one another in one work operation. Cost-intensive serial bonding with contact wires, as is known from the prior art, is thus obviated. A further advantage is that, unlike in the case of bonding wires, the conductor tracks routed on the interconnection film can not cause a short circuit, and they can maintain their distance reliably supported by the film.

In a further embodiment of the invention, the semiconductor chip has flip-chip contacts which are connected via rewiring lines to the contact pads. These wiring lines are situated on the upper side of the wiring substrate and are connected via through contacts to the underside of the wiring substrate, from where in turn wiring lines on the underside of the wiring substrate are connected to external contact areas. Said external contact areas can then be populated with external contacts in order to complete the base semiconductor component.

The use of a semiconductor chip including flip-chip contacts in the base semiconductor component results in a further increase in the reliability of the base semiconductor component, especially as here as well there is no need to provide any fault-susceptible bonding wires for connection to the wiring structure on the upper side of the wiring substrate. In order to compensate for thermal stresses between the material of the stiff wiring substrate and the silicon semiconductor chip, the spacing between the semiconductor chip with flip-chip contacts and the wiring substrate is filled by a filled plastic, so-called "underfill". The filler of the plastic preferably comprises ceramic particles which match the coefficient of thermal expansion of the "underfill" to the coefficient of thermal expansion of the semiconductor chip.

In one embodiment of the invention, the external contacts may have solder balls and be arranged on the underside of the wiring substrate in a matrix. As a result, the base semiconductor component may also be embodied as a standard housing of BGA design, so that it can be applied to corresponding standard circuit carriers.

Furthermore, the interconnection film is arranged on the rear side of the base semiconductor chip. This arrangement has the advantage of a minimal structural height of the base semiconductor component, especially as the rear side of the base semiconductor chip does not have any flip-chip contacts and can thus bear fully on the rear side of the base semiconductor chip. A semiconductor chip with bonding connections is used as the base semiconductor chip, then it is possible to provide this semiconductor chip, on the wiring substrate, with a plastic housing composition after the production of the bonding connection, so that in that case, too, there is a possibility of applying the interconnection film on the plastic housing composition, by way of example.

For a base semiconductor component that is intended to carry a stacked semiconductor component having a larger areal extent than that of the base semiconductor chip, provision is made for arranging a supporting plate between the interconnection film and the semiconductor chip. Said supporting plate imparts dimensional stability to the interconnection film and ensures that the stack contact areas of the interconnection film are completely arranged in one plane. Consequently, the base semiconductor component and the stacked semiconductor component can then be electrically connected via the stack contact areas of the interconnection film. In this case, the arrangement of the stack contact areas can be adapted to the respective customized semiconductor component to be stacked.

A further embodiment of the invention provides for the interconnection film to have a plurality of mutually insulated layers with intervening conductor tracks. Such a multilayer interconnection film is advantageously used where the stack contact area density, and also the absolute number of stack contact areas is to be connected to a correspondingly high number of wiring lines, and the distances between the stack contact areas do not suffice to route enough conductor tracks to the edge sides of the interconnection film.

Furthermore, provision is made, in one embodiment of the invention, for embedding the connection locations between contact pads and conductor tracks of the interconnection film, in the edge regions of the wiring substrate, in a plastics composition. Said plastics composition thus protects the edge regions of the base semiconductor component in which all the connections, both to the stacked semiconductor component and to the base semiconductor chip and also to the external contacts, converge.

A method for the production of a base semiconductor component has the following method steps. The first step involves producing a stiff wiring carrier with a central semiconductor chip on its upper side. For this purpose, a wiring pattern is provided on the upper side of the wiring carrier, with contact pads in edge regions of the upper side and also with external contact areas on its underside opposite to the upper side. In this case, the external contact areas and the contact pads, and also the contact areas of an integrated circuit of the semiconductor chip are electrically connected to one another on the wiring carrier.

A deformable interconnection film with stack contact areas on its upper side is produced in addition to the production of a stiff wiring carrier. The stack contact areas are arranged in an arrangement pattern on the upper side in such a way that they are congruent with respect to an arrangement pattern of external contacts of a semiconductor component to be stacked. By means of corresponding conductor tracks on its underside which are connected to the stack contact areas and extend right into the edge region of the intermediate carrier film, a connection is produced between the contact pads of the wiring substrate and the stack contact areas. For this purpose, the arrangement pattern of the conductor tracks in the edge region of the intermediate wiring film is constructed congruently with respect to the arrangement pattern of the contact pads in the edge region of the wiring substrate. The interconnection film is then applied by its underside onto the wiring carrier with semiconductor chip. Afterward, the edge sides of the interconnection film are deformed with the conductor tracks being connected to the contact pads in the edge regions of the wiring substrate.

This method has the advantage that the pattern of the stack contact areas of the interconnection film can be designed independently of an arrangement pattern of the external contacts of the base semiconductor component. An interconnection film of this type can be produced inexpensively and is suitable for mass production and can nevertheless be adapted to customer-specific desires by means of its arrangement pattern for the stack contact areas. This means that the customer or purchaser of the base semiconductor components can arrange one of said customer's or purchaser's standard semiconductor components on the interconnection film and can thus inexpensively increase the modularity of said customer's or purchaser's products. Moreover, the principle of the concept of the invention enables a further interconnection film to be provided for the stacked semiconductor component as well, which further interconnection film can likewise be electrically connected to the semiconductor components arranged underneath in the edge regions of the stiff wiring pattern.

Furthermore, the method has the advantage that in contrast to the bonding wire connection with a bonding step for each edge region, a multiplicity of conductor tracks of the interconnection film can be connected to the contact pads on the stiff wiring substrate. Finally, the method yields a significantly more robust base semiconductor component since bonding wires are no longer required nor is it necessary to form any loops of flexible wiring films projecting from the semiconductor stack. Moreover, the density of the connections can be increased in comparison with bonding wire connections, especially as dimensions of bonding tools such as bonding styli or bonding cannulae do not have to be taken into account in the dimensioning of the pitch of the contact pads and the center-to-center distance between the conductor tracks of the interconnection film.

In a further exemplary implementation of the method, before the interconnection film is applied onto the wiring substrate, a supporting plate is applied onto the underside of the interconnection film. This relatively stiff interconnection plate is provided whenever the semiconductor chip arranged in the base semiconductor component has smaller area dimensions than the underside of the semiconductor component to be stacked. The supporting plate firstly levels the film in the region of the stack contact areas and ensures that no unevennesses occur for the stack contact areas when bending away the edge regions of the interconnection film with the conductor tracks on its underside. The material of the supporting plate may be a fiber-reinforced plastic, or else a metal plate provided with an insulation layer on all sides.

In a further preferred implementation of the method, before the interconnection film is applied, the semiconductor chip is embedded in a plastics composition. The plastics composition and its areal extent can advantageously enlarge the dimensions of the embedded semiconductor chip in such a way that a supporting plate is not required. A further advantage is that with the aid of the plastics composition, it is also possible to use semiconductor base chips which do not have any flip-chip contacts, but rather are connected via bonding connections to a wiring structure on the upper side of the wiring substrate. Such bonding connections for semiconductor chips which do not have any flip-chip contacts are mounted prior to the embedding of the semiconductor chip, and this is followed by the application of the plastic housing composition, the areal extent of which corresponds at least to the dimensions of the planned stack contact areas of the interconnection film.

After the conductor tracks have been connected to the contact pads, the connection locations may likewise be embedded in a plastics composition. A dispensing process or a molding process is used for this purpose, so that these sensitive connection locations are protected against mechanical loads.

To summarize, it can be stated that the invention solves the stack problem by means of a variant of TAB (tape automated bonding) by creating a new interconnection film enabling a three-dimensional stacking of semiconductor components to form semiconductor modules. In order to form a base semiconductor component, a TAB-based interconnection film is placed onto a base housing. Said interconnection film comprises a carrier material, such as a polyimide, on which the structured copper conductor tracks are applied. This plane of copper conductor tracks additionally realizes stack contact areas for a semiconductor component to be stacked. Conductor tracks lead from the stack contact areas to the edge of the interconnection film in order later to be connected to the base housing. If the required bearing area for the semiconductor component to be stacked is larger than the base semiconductor chip, a stiffening plate or supporting plate can be arranged between the interconnection film and the base semiconductor chip, for example made of an FR4 or BT material. For connecting the conductor tracks of the TAB interconnection film and the contact pads of the base housing, use may be made of an iron soldering method, for example, in which a multiplicity of connection points in one of the edge regions are soldered together simultaneously. When soldering with the aid of the iron soldering method, use may be made of materials having a high melting point, for example, which, for their part, form intermetallic compounds or alloys having a high melting point during soldering, such as AuSn for example.

The method according to the invention and also the base semiconductor component according to the invention have the advantages that:

1. wiring substrates having a plurality of layers, such as a 4-layer substrate for example, can be used for complex "routings";

2. the reliability especially in a temperature cycle test method on printed circuit boards with the use of a base semiconductor component including a semiconductor chip with flip-chip contacts is improved in comparison with the construction known from the document DE 101 38 278.

FIG. 1 illustrates a basic schematic diagram of a base semiconductor component 1 of a first embodiment of the invention, in perspective view. Said base semiconductor component 1 is the base for a semiconductor component stack, that is to say that on the base semiconductor component 1 there is intended to be space for a stacked semiconductor component whose external contact arrangement is independent of the external contact arrangement of the base semiconductor component 1 and independent of the wiring structure of a stiff wiring substrate 4 of the base semiconductor component 1.

For this purpose, the base semiconductor component 1 has the stiff wiring substrate 4 including a carrier plate made of plastic, which forms an upper side 5 and an underside 9 of the wiring substrate 4. On the wiring substrate 4, a semiconductor chip 3 is arranged in the center on the upper side 5, which semiconductor chip, in this first embodiment of the invention, has flip-chip contacts by which it is connected to a wiring structure on the upper side 5 of the wiring substrate 4. Said wiring structure furthermore has wiring lines which extend as far as the edge regions 6 and 7 of the wiring substrate 4, where they merge into contact pads 8.

At the same time, through contacts extend from the wiring structure on the upper side 5 of the wiring substrate 4 to the underside 9 of the wiring substrate 4. On the underside 9, the through contacts may merge into external contact areas populated with external contacts of the base semiconductor component 1. Moreover, conductor tracks 22 may lead from the through contacts to individual external contact areas in order to connect the through contacts to the external contacts.

The base semiconductor component 1 illustrated here is illustrated with all the protective plastics compositions having been removed, in order to illustrate construction of the base component 1. Consequently, FIG. 1 illustrates that the rear side 25 of the semiconductor chip 3 is covered by a supporting plate 26. The supporting plate 26 may be constructed from plastic, such as an FR4 material or a BT material, and serves as a bearing area for the intermediate wiring film 14. Moreover, the supporting plate 26 stabilizes the mounting plane for a semiconductor component to be stacked on the interconnection film 14. For this purpose, the interconnection film 14 has stack contact areas 17 in an arrangement pattern 16 corresponding to the external contact pattern of the semiconductor component to be stacked.

The stack contact areas 17 can be accessed from the upper side 15 of the intermediate wiring film 14. The stack contact areas 17 are electrically connected via conductor tracks 22 on the underside 29 of the interconnection film 14 to the contact pads 8 on the wiring substrate 4 in the edge regions 6 and 7. For this purpose, the intermediate wiring film 14 is bent away in its edge regions 20 and 21 to the contact pads 8 of the wiring substrate 4. The contact pads 8 are thus nodes for connections between the stack contact areas 17 and the contact areas of the semiconductor chip 3, and also the external contact areas of the wiring substrate 4.

The supporting plate 26 made of metal or an insulating plate made of FR4 or PT material provides for stiffening in the region of the arrangement pattern 16 for the interconnection film 14. Semiconductor chips with bonding contact areas may also be used instead of the semiconductor chip 3 with flip-chip contacts. In that case, however, bonding wires which proceed from the contact areas of the semiconductor chip have to be protected by a correspondingly dimensioned plastic housing composition on the semiconductor chip 3 before an interconnection film 14 is fitted. Such an exemplary embodiment of the invention is illustrated later in a schematic cross section by FIG. 7.

FIGS. 2 to 7 illustrate schematic cross sections through component elements in the course of the production of a base semiconductor component 1. Elements having the same functions as in FIG. 1 are identified by the same reference symbols and are not discussed separately.

Figure 2:
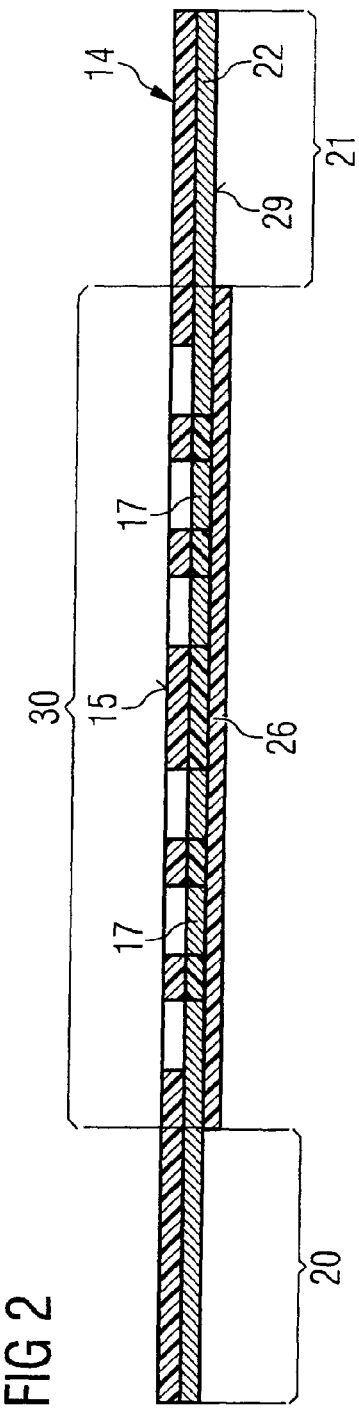

FIG. 2 illustrates a schematic cross section of an interconnection film 14 with a supporting plate 26. The supporting plate 26 stiffens the flexible intermediate wiring film 14 in a central region 30 having the stack contact areas 17 for the connection of a stacked semiconductor component. While the central region 30 is kept flat and level by the supporting plate 26, the interconnection film 14 remains sufficiently flexible in its edge regions 20 and 21 to be bent away in the edge regions 20 and 21. In the edge regions 20 and 21, the interconnection film 14 has conductor tracks 22 which are electrically connected to the stack contact areas 17. Since the conductor tracks 22 are arranged on the underside 29 of the interconnection film 14, they can be electrically connected to contact pads on a wiring substrate by bending away their edge regions 20 and 21, without the central region 30 stiffened by the supporting plate 26 warping or bending.

Figure 3:
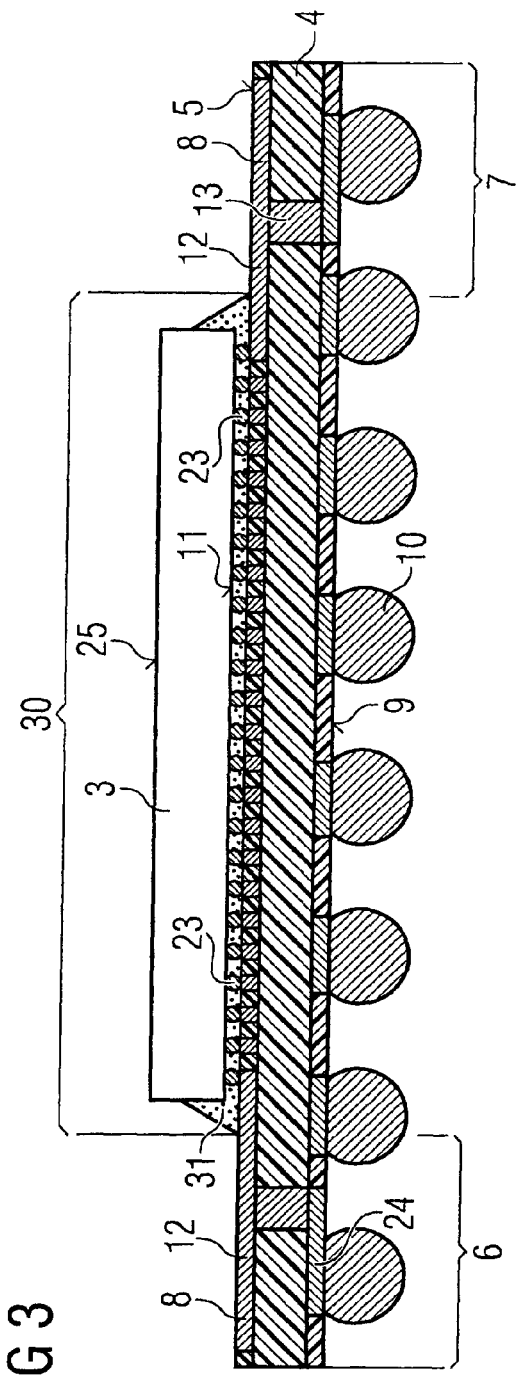

FIG. 3 illustrates a schematic cross section of a stiff wiring substrate 4 with semiconductor chip 3. The semiconductor chip 3 has a planar and level rear side 25, and has flip-chip contacts 23 on its active upper side 11. Said flip-chip contacts 23 are connected to contact pads 8 via wiring lines 12, and are electrically connected via through contacts 13 and external contact areas 24 and external contacts 10 on the underside 9 of the wiring substrate 4. While the semiconductor chip 3 is arranged in the central region 30 of the wiring substrate 4, the contact pads 8 on the upper side 5 are arranged in the edge regions 6 and 7 of the wiring substrate 4. For assembly of the interconnection film 14 illustrated in FIG. 2 with the stiff wiring substrate 4 illustrated in FIG. 3, the interconnection film 14 is arranged with its supporting plate 26 on the rear side 25 of the semiconductor chip 3, as illustrated in FIG. 4.

Prior to the emplacement of the interconnection film 14, the interspace that arises as a result of the flip-chip contacts 23 between the semiconductor chip 3 and the wiring substrate 4 was filled with a particle-filled plastic, a so-called "underfill"

31, in order to compensate for thermal loads between the semiconductor chip 3 and the wiring substrate 4.

Figure 4:
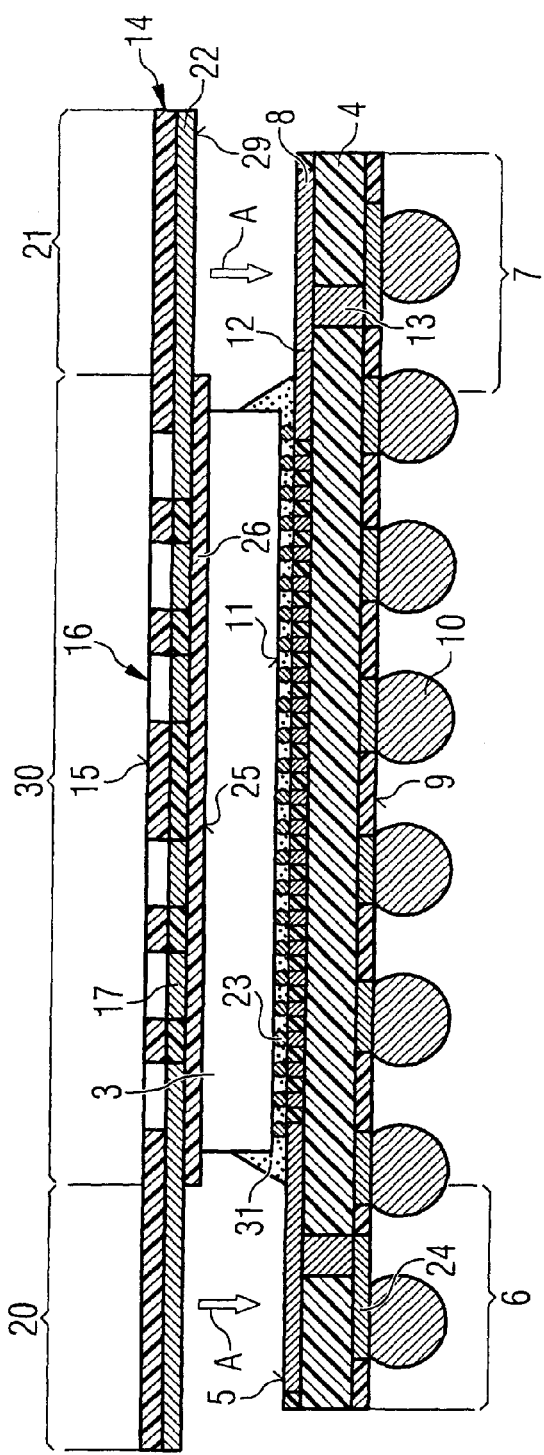

FIG. 4 illustrates a schematic cross section through a wiring substrate 4 with semiconductor chip 3 and emplaced interconnection film 14. In a next step, the conductor tracks 22 of the interconnection film 14 together with the contact pads 8 of the stiff wiring substrate 4 are then electrically and mechanically connected to one another.

Figure 5:
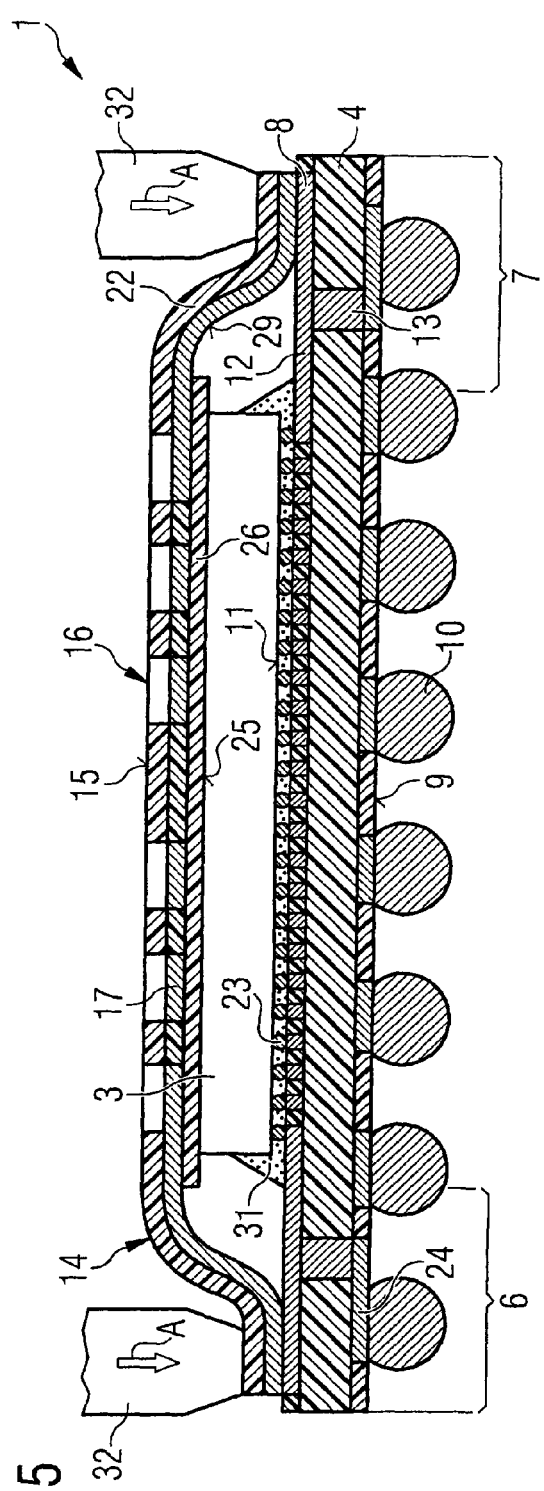

FIG. 5 illustrates a schematic cross section through a wiring substrate 4 after the bending away of edge regions 20 and 21 of the interconnection film 14 and electrical connection of the contact pads 8 of the wiring substrate 4 to conductor tracks 22 of the interconnection film 14. For this purpose, a soldering tool 32, having two soldering irons in this embodiment, is placed onto the edge regions 20 and 21 of the interconnection film 14 and pressed onto the contact pads 8 in arrow direction A, with simultaneous heating of the edge regions 6 and 7 of the wiring plate 4. For this purpose, the contact pads 8 have corresponding coatings made of a soldering material, which forms a eutectic alloy with the material of the conductor tracks 22 of the interconnection film 14. However, besides eutectic solders it is also possible to use diffusion solders that form intermetallic compounds having a high melting point during the soldering process, or to use simple and inexpensive solder materials, such as tin solders.

FIG. 6 illustrates a schematic cross section through a base semiconductor component 1 with an applied plastic covering 28 of the electrical connections. In this embodiment of the invention, said plastic covering 28 is applied by means of a dispensing method, but may also be applied by means of a molding method or by means of a dipping method or a jet dispensing method for the protection of the node represented by the contact pads 8. The bending away of conductor tracks 22 of an interconnection film 14 has the advantage over a bonding method that firstly it is possible to provide contact pads 8 arranged more densely alongside one another since bonding tools do not have to be taken into consideration, and secondly this method has the advantage that all the connection locations or nodes of an edge region can be produced simultaneously in one work operation.

FIG. 7 illustrates a schematic cross section through a base semiconductor component 100 of a second embodiment of the invention. The difference from the first embodiment of the invention illustrated in FIG. 1 and FIG. 6 is that, in this embodiment of the invention, the semiconductor chip 3 is embedded in a plastics composition 27, and said plastics composition 27 carries the interconnection film 14 and stiffens the latter in its central region in such a way that the stack contact areas 17 lie in one plane and are not deformed during the bending away of the edge regions 20 and 21 of the interconnection film 14. Wire bonding connections may also be embedded in the plastics composition 27 if the semiconductor chip 3 has contact pads of a bondable semiconductor chip and does not have any flip-chip contacts 23 as illustrated in FIG. 7. The plastics composition 27 then has the effect not only of forming one plane for the stack contact areas, but also at the same time of affording mechanical protection of the bonding connections then present.

Figure 8:
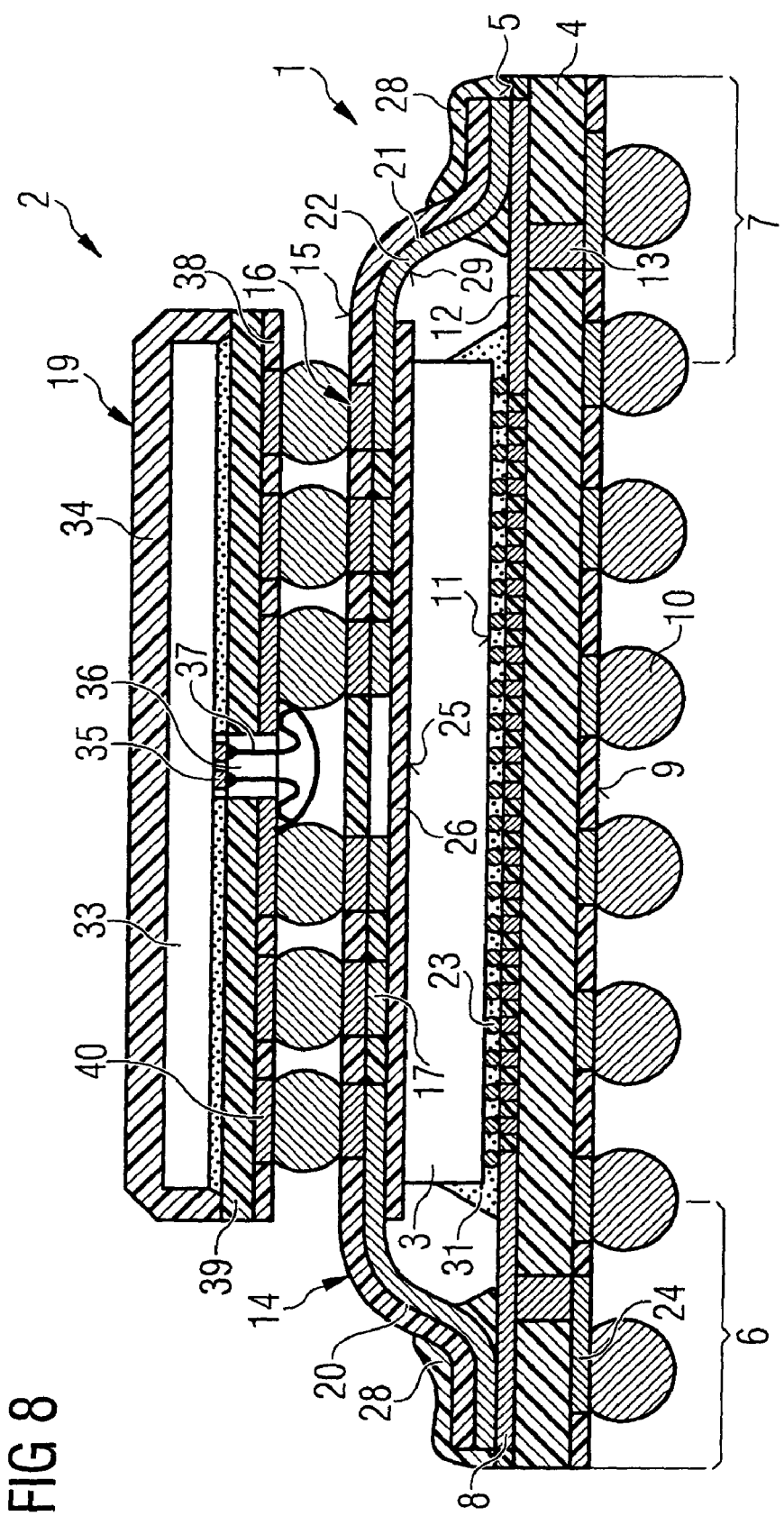
FIG. 8 illustrates a schematic cross section through a semiconductor component stack with a base semiconductor component of the first embodiment of the invention.

FIG. 8 illustrates a schematic cross section through a semiconductor component stack 2 with a base semiconductor component 1 of the first embodiment of the invention. Elements having the same functions as in FIG. 1 are identified by the same reference symbols and are not discussed separately.

In this semiconductor component stack 2, a further component, e.g., a DRAM 34 (dynamic random access memory), or other memory elements such as flash, SRAM, or elements with stacked chip combinations having flash, SRAM and/or DRAM, is applied on the base semiconductor component 1, for which purpose the external contacts 18 of the stacked semiconductor component 19 are soldered onto the stack contact areas 17. The design of the DRAM 34 illustrated by way of example here differs from the design of the base semiconductor component 1 by the fact that no flip-chip contacts are present for the semiconductor chip 33 of the stacked semiconductor component 19, rather the semiconductor chip 33 has contact areas 35 in a bonding channel 36 which are connected via bonding wire connections 37 to a rewiring layer 38 of a rewiring substrate 39. The rewiring layer 38 has external contact areas 40, the arrangement pattern of which corresponds to the arrangement pattern 16 of the stack contact areas 17 of the semiconductor base component 1.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

The invention claimed is:

1. A base semiconductor component for a semiconductor component stack comprising:
    a semiconductor chip arranged on a stiff wiring substrate, wherein an active upper side of the semiconductor chip faces toward the wiring substrate, the wiring substrate having contact pads on its upper side in edge regions and external contacts of the base semiconductor component on its underside opposite to the semiconductor chip;
    contact areas of an integrated circuit of the active upper side of the semiconductor chip, the external contacts, and the contact pads are electrically connected to one another via wiring lines and through contacts of the wiring substrate;
    a deformable interconnection film defines an upper side of the base semiconductor component and has a freely accessible arrangement pattern of stack contact areas arranged congruently with respect to external contacts of a semiconductor component to be stacked;
    the interconnection film is deformed in its edge regions toward the contact pads of the wiring substrate;
    the stack contact areas are electrically connected to the contact pads of the wiring substrate via conductor tracks of the interconnection film; and
    a supporting plate arranged between the interconnection film and the semiconductor chip.

2. The base semiconductor component of claim 1, wherein the semiconductor chip has flip-chip contacts which are connected via wiring lines to the contact pads, and via wiring lines on the upper side and through contacts to the underside of the wiring substrate, and also via wiring lines on the underside of the wiring substrate to external contact areas, the external contact areas having the external contacts.

3. The base semiconductor component of claim 2, wherein the external contacts have solder balls and are arranged on the underside of the wiring substrate in a matrix.

4. The base semiconductor component of claim 1, wherein the interconnection film is arranged on a rear side of the semiconductor chip.

5. The base semiconductor component of claim 1, wherein the base semiconductor component and the stacked semiconductor component are electrically connected via the stack contact areas of the interconnection film.

6. The base semiconductor component of claim 1, wherein the interconnection film has a plurality of mutually insulated layers with conductor tracks.

7. The base semiconductor component of claim 1, wherein the semiconductor chip of the base semiconductor component is embedded in a plastics composition.

8. The base semiconductor component as claimed in claim 1, wherein connection locations between contact pads and conductor tracks of the interconnection film, in the edge regions of the wiring substrate, are embedded in a plastic covering.

9. A method for the production of a base semiconductor component comprising:
    producing a stiff wiring carrier with a central semiconductor chip having an active upper side disposed on an upper side of the wiring carrier, the wiring carrier having contact pads in edge regions of the upper side and external contact areas on an underside of the wiring carrier, the external contact areas and the contact pads and also contact areas of an integrated circuit of the semiconductor chip being electrically connected to one another;
    producing a deformable interconnection film with stack contact areas on its upper side, which have an arrangement pattern that is congruent with respect to an arrangement pattern of external contacts of a semiconductor component to he stacked, and with conductor tracks on its underside, which are connected to the stack. contact areas and extend right into the edge regions of the deformable interconnection film, the conductor tracks having an arrangement pattern that is congruent with respect to the arrangement pattern of the contact pads:
    applying the interconnection film by its underside onto the wiring carrier with semiconductor chip; and
    deforming the edge sides of the interconnection film with the conductor tracks being connected to the contact pads; and
    before the interconnection film is applied onto the wiring carrier, applying a supporting plate onto the underside of the interconnection film.

10. The method as claimed in claim 9, further including, before the interconnection film is applied, embedding the semiconductor chip in a plastics composition.

11. The method as claimed in claim 9, further including, after the conductor tracks have been connected to the contact pads, embedding the connection locations in a plastic covering.

12. A base semiconductor component for a semiconductor component stack comprising:
    a semiconductor chip arranged on a stiff wiring substrate, wherein an active upper side of the semiconductor chip faces toward the wiring substrate, the wiring substrate having contact pads on its upper side in edge regions and external contacts of the base semiconductor component on its underside opposite to the semiconductor chip;
    contact areas of an integrated circuit of the active upper side of the semiconductor chip and/or the external contacts together with the contact pads are electrically connected to one another via wiring lines and/or through contacts of the wiring substrate;
    a deformable interconnection film defines an upper side of the base semiconductor component and has a freely accessible arrangement pattern of stack contact areas arranged congruently with respect to external contacts of a semiconductor component to be stacked;
    the interconnection film is deformed in its edge regions toward the contact pads of the wiring substrate; and
    the stack contact areas are electrically connected to the contact pads of the wiring substrate via conductor tracks of the interconnection film, and
    wherein the interconnection film is arranged on a rear side of the semiconductor chip, with a supporting plate is arranged between the interconnection film and the semiconductor chip.

13. The base semiconductor component of claim 12, wherein the base semiconductor component and the stacked semiconductor component are electrically connected via the stack contact areas of the interconnection film.

14. The base semiconductor component of claim 13, wherein the interconnection film has a plurality of mutually insulated layers with conductor tracks.

15. The base semiconductor component of claim 14, wherein the semiconductor chip of the base semiconductor component is embedded in a plastics composition.

* * * * *

UNITED STATES PATENT AND TRADEMARK OFFICE
CERTIFICATE OF CORRECTION

PATENT NO. : 7,755,178 B2
APPLICATION NO. : 10/598483
DATED : July 13, 2010
INVENTOR(S) : Hagen et al.

It is certified that error appears in the above-identified patent and that said Letters Patent is hereby corrected as shown below:

Column 11, line 28, delete "to he" and insert in place thereof --to be--.

Column 11, line 29, delete "stack. contact" and insert in place thereof --stack contact--.

Signed and Sealed this

Twenty-sixth Day of October, 2010

David J. Kappos
*Director of the United States Patent and Trademark Office*